(12) United States Patent
Torpey et al.

(10) Patent No.: US 12,451,867 B2
(45) Date of Patent: Oct. 21, 2025

(54) ACOUSTIC RESONATOR FILTER BANK SYSTEM

(71) Applicants: Matthew S. Torpey, Ellicott City, MD (US); Robert S. Howell, Silver Spring, MD (US)

(72) Inventors: Matthew S. Torpey, Ellicott City, MD (US); Robert S. Howell, Silver Spring, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 285 days.

(21) Appl. No.: 18/181,698

(22) Filed: Mar. 10, 2023

(65) Prior Publication Data

US 2023/0299745 A1     Sep. 21, 2023

Related U.S. Application Data

(60) Provisional application No. 63/321,084, filed on Mar. 17, 2022.

(51) Int. Cl.
    *H03H 9/64*          (2006.01)
    *H03H 9/72*          (2006.01)
(52) U.S. Cl.
    CPC ........ *H03H 9/6483* (2013.01); *H03H 9/6403* (2013.01); *H03H 9/72* (2013.01)
(58) Field of Classification Search
    CPC ...... H03H 9/6483; H03H 9/542; H03H 9/605; H03H 9/706; H03H 9/725; H03H 7/1758;
(Continued)

(56) References Cited

U.S. PATENT DOCUMENTS 10,187,109 B2    1/2019   Yuden
2008/0290948 A1   11/2008   Fujii
(Continued)

FOREIGN PATENT DOCUMENTS

CN       108476014 A    8/2018
JP        2022012383 A   1/2022

OTHER PUBLICATIONS

Palanisamy, S.; Thangaraju, B.; Khalaf, O.I.; Alotaibi, Y.; Alghamdi, S. Design and Synthesis of Multi-Mode Bandpass Filter for Wireless Applications. Electronics 2021, 10, 2853. (Year: 2021).*

(Continued)

*Primary Examiner* — Lincoln D Donovan
*Assistant Examiner* — Tyler J Pereny
(74) *Attorney, Agent, or Firm* — Tarolli, Sundheim, Covell & Tummino LLP

(57) ABSTRACT

One example includes an acoustic resonator filter bank system. The system includes a multiplex passive filter that is configured to provide a plurality of filtered versions of a radio frequency (RF) input signal. The system also includes a filter bank that comprises a plurality of filter blocks that are each configured to provide a plurality of pass-bands across a frequency spectrum. Each of the filter blocks includes an acoustic resonator. The system further includes a switch matrix that is configured to provide one of the filtered versions of the RF input signal to one of the filter blocks in the filter bank to provide an RF output signal having a frequency band corresponding to a respective one of the pass-bands.

16 Claims, 4 Drawing Sheets

(58) Field of Classification Search
CPC .... H03H 7/463; H03H 9/02007; H03H 9/205; H03H 7/0115; H03H 2007/013; H03H 7/0138; H03H 7/1766; H03H 9/64; H03H 9/568; H03H 9/6403; H04B 1/1036; H04B 1/0475; H04B 1/40; H04B 1/48; H04B 1/0057; H04B 2001/485
See application file for complete search history.

(56) References Cited

U.S. PATENT DOCUMENTS

| | | | |
|---|---|---|---|
| 2016/0142077 A1 | 5/2016 | Jeong et al. | |
| 2017/0288045 A1 | 10/2017 | Nechay et al. | |
| 2018/0041190 A1* | 2/2018 | Yoshimura | H03H 1/0007 |
| 2019/0379352 A1* | 12/2019 | Nosaka | H03H 9/6403 |
| 2020/0014370 A1* | 1/2020 | Matsubara | H03H 9/568 |
| 2020/0014527 A1 | 1/2020 | Subramaniam | |
| 2020/0213168 A1 | 7/2020 | Bala et al. | |
| 2021/0099151 A1 | 4/2021 | Burgener et al. | |
| 2021/0111696 A1 | 4/2021 | Rinaldi et al. | |
| 2021/0119598 A1 | 4/2021 | Ta et al. | |
| 2021/0184706 A1 | 6/2021 | Hisano et al. | |
| 2022/0006443 A1* | 1/2022 | Nishio | H04B 1/0057 |
| 2022/0077848 A1 | 3/2022 | Yu et al. | |
| 2022/0321101 A1* | 10/2022 | Liu | H03H 9/02015 |

OTHER PUBLICATIONS

TW112109710_OA; Office Action issued Apr. 3, 2024 for corresponding Taiwan patent application No. 112109710.

International Search Report and Written Opinion for corresponding PCT/US2023/014976, dated Jun. 30, 2023, pp. 1-9.

KROA: Office Action issued May 15, 2025 for corresponding Korean application No. 10-2024-7031983.

EESR: Extended European Search Report issued Jul. 31, 2025 for corresponding EP 23 77 1258.

* cited by examiner

ACOUSTIC RESONATOR FILTER BANK SYSTEM

CROSS REFERENCE TO RELATED APPLICATION

This application claims priority from U.S. Provisional Patent Application No. 63/321,084, filed 17 Mar. 2022, which is incorporated herein by reference in its entirety.

TECHNICAL FIELD

The present disclosure relates generally to communications, and specifically to an acoustic resonator filter bank system.

BACKGROUND

Resonator circuits are implemented in a variety of different types of applications, such as to filter ranges of frequencies. A variety of different types of resonators exist. One such type of resonator is an acoustic resonator that implements acoustic waves on an integrated circuit (IC). Acoustic resonators include bulk acoustic wave (BAW) resonators and standing acoustic wave (SAW) resonators. Acoustic wave resonators are designed to provide confinement of the acoustic energy in the resonator to increase quality factor (Q) of the resonator. As an example, conventional acoustic resonators can provide for effective filtering in a narrow band about a center frequency (e.g., +/− approximately 5 dB).

One example includes an acoustic resonator filter bank system. The system includes a multiplex passive filter that is configured to provide a plurality of filtered versions of a radio frequency (RF) input signal. The system also includes a filter bank that comprises a plurality of filter blocks that are each configured to provide a plurality of pass-bands across a frequency spectrum. Each of the filter blocks includes an acoustic resonator. The system further includes a switch matrix that is configured to provide one of the filtered versions of the RF input signal to one of the filter blocks in the filter bank to provide an RF output signal having a frequency band corresponding to a respective one of the pass-bands.

Another example includes a method for filtering an RF input signal via an acoustic resonator filter bank system. The method includes providing the RF input signal to a multiplex passive filter of the acoustic resonator filter bank system. The multiplex passive filter includes a low-pass filter configured to provide a low-pass filtered version of the RF input signal, a band-pass filter configured to provide a band-pass filtered version of the RF input signal, and a high-pass filter configured to provide a high-pass filtered version of the RF input signal. The method also includes providing a plurality of selection switching signals to a switch matrix that is configured to receive each of the low-pass, pass-band, and high-pass filtered versions of the RF input signal and to selectively switch one of the low-pass, pass-band, and high-pass filtered versions of the RF input signal to one of a plurality of filter blocks in a filter bank. Each of the filter blocks includes an acoustic resonator and is configured to provide a first pass-band, a second pass-band higher than the first pass-band, and a third pass-band higher than the second pass-band to provide an RF output signal having a frequency band corresponding to a respective one of the first pass-band, the second pass-band, and the third pass-band.

Another example includes an integrated circuit (IC) comprising an acoustic resonator filter bank system. The system includes an input switch configured to provide an RF input signal to one of a plurality of filter paths. The system also includes a plurality of multiplex passive filters that are each associated with a respective one of the filter paths. Each of the multiplex passive filters can be configured to provide a plurality of filtered versions of the RF input signal in response to receiving the RF input signal from the input switch. The system also includes a plurality of filter banks that are each associated with a respective one of the filter paths. Each of the filter banks can include a plurality of filter blocks that are each configured to provide a plurality of pass-bands across a frequency spectrum. Each of the filter blocks includes an acoustic resonator. The system further includes a plurality of switch matrices that are each associated with a respective one of the filter paths. Each of the switch matrices can be configured to provide one of the filtered versions of the RF input signal to one of the filter blocks in a respective one of the filter banks to provide an RF output signal having a frequency band corresponding to a respective one of the pass-bands.

DETAILED DESCRIPTION

Figure 1:
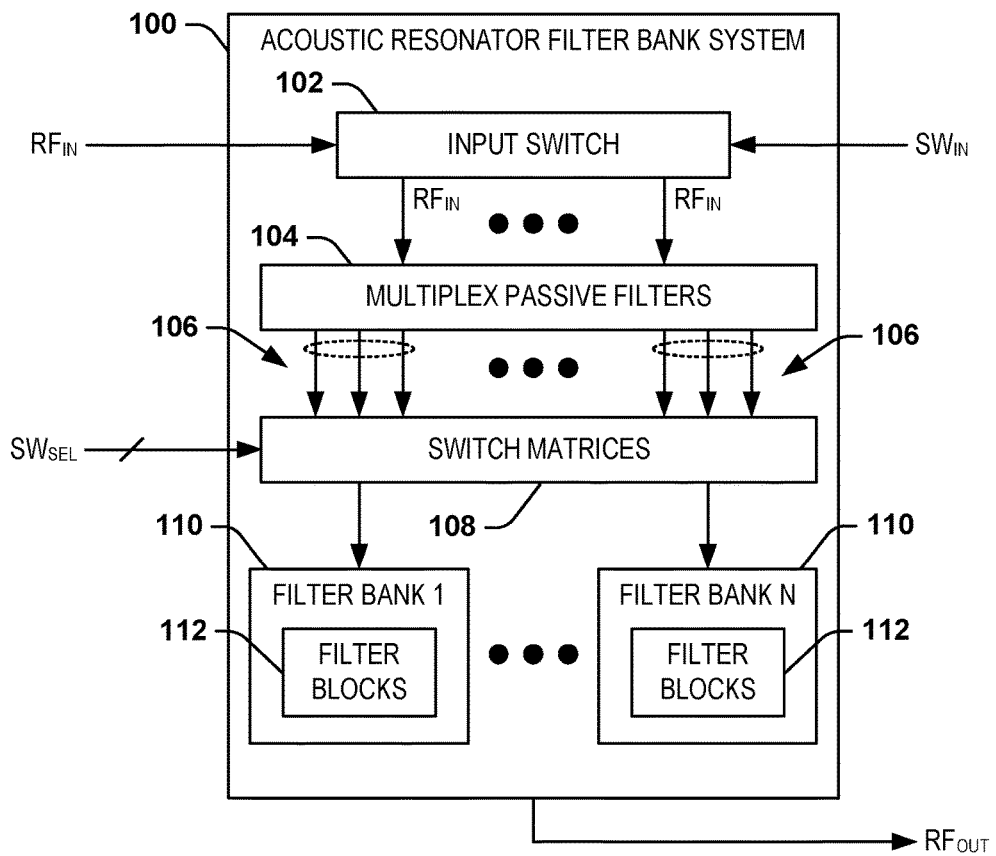
FIG. 1 illustrates an example block diagram of an acoustic resonator filter bank system.

The present disclosure relates generally to communications, and specifically to an acoustic resonator filter bank system. The acoustic resonator filter bank system can be implemented in any of a variety of communications systems, such as in a transmit and/or a receive path of a wireless transceiver. The acoustic resonator filter bank system includes one or more filter paths that can be selected to provide selective filtering of a radio frequency (RF) input signal across a frequency spectrum. Each of the filter paths includes a filter bank, with each of the filter banks including a plurality of filter blocks that are each configured to provide a plurality of pass-bands, such as being harmonically related. Each of the filter blocks includes a plurality of filter elements that each include an acoustic resonator and a capacitive network. As an example, the acoustic resonator can be configured as a combined overtone resonator (COR). As another example, the capacitive network can include at least one capacitor provided in parallel with the acoustic resonator.

Each filter path of the acoustic resonator filter bank system also includes a multiplex passive filter that is configured to receive the RF input signal and to provide a plurality of filtered versions of the RF input signal. For example, the multiplex passive filter can include a low-pass filter configured to provide a low-pass filtered version of the RF input signal, a band-pass filter configured to provide a band-pass filtered version of the RF input signal, and a high-pass filter configured to provide a high-pass filtered version of the RF input signal. Each filter path can also include a switching matrix. The switching matrix is configured to receive selection switching signals to selectively switch one of the filtered versions of the RF input signal to one of the filter blocks in the respective filter bank. As an example, the switch matrix can be formed from super lattice castellated gate field effect transistor (SLCFET) switches to accommodate a broad frequency band of the RF input signal. Therefore, based on which of the filtered versions of the RF input signal is provided to a given one of the filter blocks, the filter block can provide an RF output signal having a frequency band corresponding to a specific one of the pass-bands of the filter block.

For example, the pass-bands of each of the filter blocks can be distinct, such that the pass-bands across all of the filter blocks can span the entirety of a frequency spectrum in an uninterrupted manner. Therefore, by selectively switching one of the filtered versions of the RF input signal to a given one of the filter blocks of a given filter path, the acoustic resonator filter bank system can provide for a frequency band of the RF output signal corresponding to a single pass-band across the entirety of the frequency spectrum. Thus, the acoustic resonator filter bank system can provide for specific selectivity of a pass-band across a large RF frequency spectrum. As another example, based on the structure of the filter blocks in the filter banks of the acoustic resonator filter bank system, the acoustic resonator filter bank system can be implemented on an integrated circuit to provide for a compact filtering package that is able to provide selective filtering across frequencies of the frequency spectrum having an order of magnitude or more of difference in wavelength. Accordingly, the acoustic resonator filter bank system can provide for flexible filtering across a broad frequency spectrum on a single compact IC chip.

FIG. 1 illustrates an example block diagram of an acoustic resonator filter bank system 100. The acoustic resonator filter bank system can be implemented in any of a variety of communications systems, such as in a transmit and/or a receive path of a wireless transceiver. As described herein, the acoustic resonator filter bank system can provide selective pass-band filtering of a radio frequency (RF) input signal, demonstrated in the example of FIG. 1 as a signal $RF_{IN}$, across a large bandwidth of a broad spectrum. As an example, the acoustic resonator filter bank system 100 can be fabricated in an integrated circuit (IC).

The acoustic resonator filter bank system 100 includes an input switch 102 that is configured to receive the RF input signal $RF_{IN}$ and an input switching signal $SW_{IN}$. The input switch 102 can thus selectively provide the RF input signal $RF_{IN}$ to a single one of a plurality N of filter paths, where N is a positive integer, in response to a state of the input switching signal $SW_{IN}$. As an example, the input switch 102 can be formed from one or more super lattice castellated gate field effect transistor (SLCFET) switches to accommodate a broad frequency band of the RF input signal $RF_{IN}$. As another example, other types of low-loss RF switches can be implemented instead of SLCFET switches, such as material phase-change switches (e.g., germanium telluride (GeTe) switches). As described in greater detail herein, each of the frequency paths can correspond to separate pass-bands of a frequency spectrum associated with the RF input signal $RF_{IN}$.

The acoustic resonator filter bank system 100 also includes a plurality N of multiplex passive filters 104 that are each associated with a respective one of the filter paths. The input switch 102 is configured to provide the RF input signal $RF_{IN}$ to one of the multiplex passive filters 104, such that the respective one of the multiplex passive filters 104 is configured to provide a plurality of filtered versions of the RF input signal $RF_{IN}$. The sets of filtered versions of the RF input signal $RF_{IN}$ are demonstrated at 106. For example, each of the multiplex passive filters 104 can include a low-pass filter configured to provide a low-pass filtered version of the RF input signal $RF_{IN}$, a band-pass filter configured to provide a band-pass filtered version of the RF input signal $RF_{IN}$, and a high-pass filter configured to provide a high-pass filtered version of the RF input signal $RF_{IN}$. The filtered versions 106 of the RF input signal $RF_{IN}$ can each have relatively large frequency bands to encapsulate a large variation of smaller pass-bands, as described in greater detail herein.

The acoustic resonator filter bank system 100 also includes a plurality N of switching matrices 108 and a plurality N of filter banks 110 that are each associated with a respective one of the filter paths. Each of the filter banks 110 includes a plurality of filter blocks 112. Each of the filter blocks 112 includes a plurality of filter elements that each include an acoustic resonator and a capacitive network. As an example, the acoustic resonator can be configured as a combined overtone resonator (COR) and can be provided in parallel with the capacitive network. The arrangement and characteristics of the acoustic resonator and capacitive network in each of the filter elements can provide for a pass-band of the respective one of the filter blocks 112 that can provide for a large bandwidth (e.g., approximately 10%) of the pass-band provided by the respective filter block 112.

Each of the switching matrices 108 is configured to receive selection switching signals $SW_{SEL}$ to selectively switch one of the filtered versions 106 of the RF input signal $RF_{IN}$ to one of the filter blocks 112 in the respective filter bank 110. As an example, the switch matrix can be formed from SLCFET switches to accommodate the broad frequency band of the RF input signal $RF_{IN}$. Therefore, based on which of the filtered versions 106 of the RF input signal $RF_{IN}$ is provided to a given one of the filter blocks 112, the filter block 112 can provide an RF output $RF_{OUT}$ signal having a frequency band corresponding to a specific one of the pass-bands of the respective filter block 112.

Figure 2:
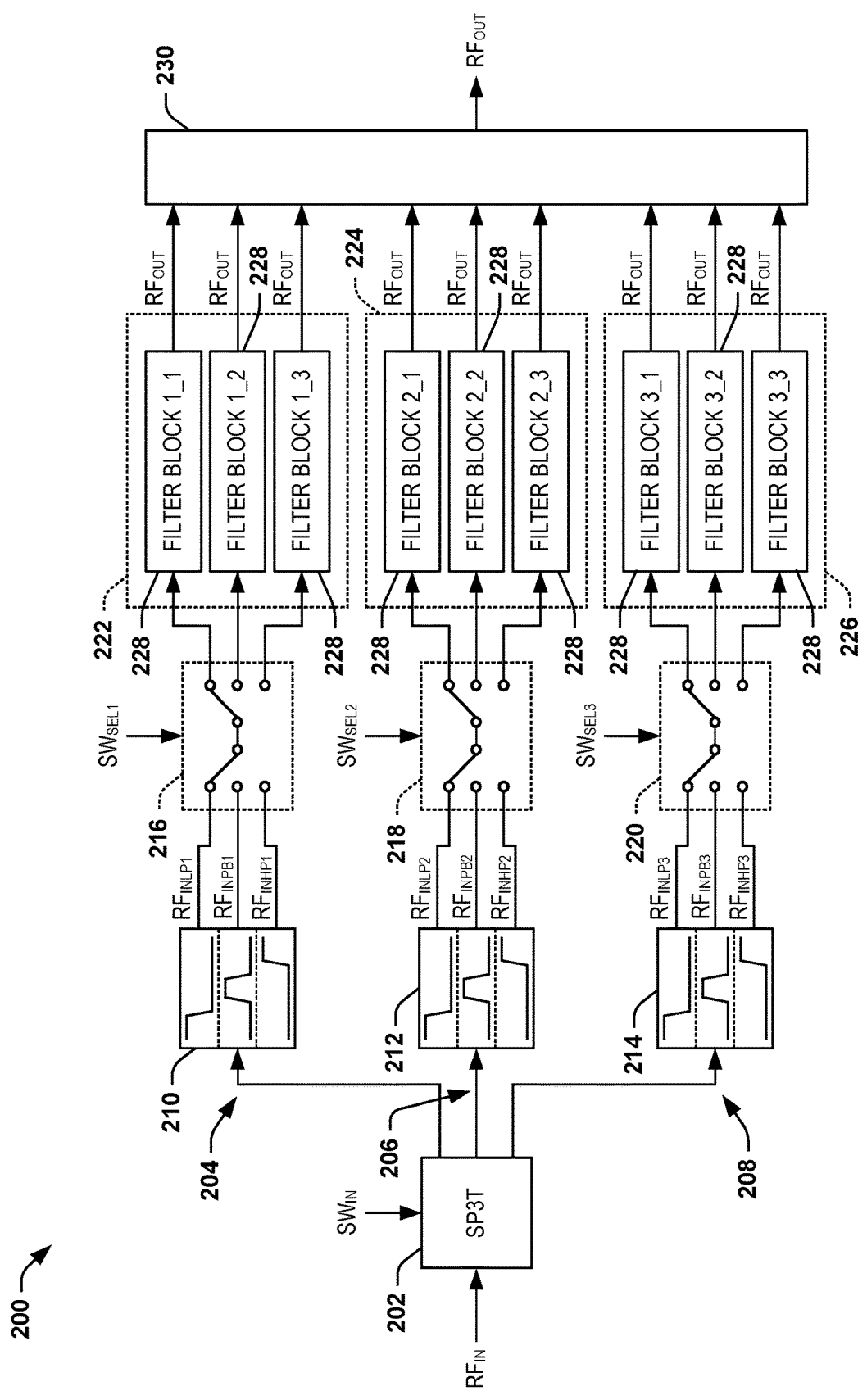
FIG. 2 illustrates an example of an acoustic resonator filter bank system.

FIG. 2 illustrates an example diagram of an acoustic resonator filter bank system 200. The acoustic resonator filter bank system can be implemented in any of a variety of communications systems, such as in a transmit and/or a receive path of a wireless transceiver. The acoustic resonator filter bank system 200 can correspond to the acoustic resonator filter bank system 100 in the example of FIG. 1. Therefore, reference is to be made to the example of FIG. 1 in the following description of the example of FIG. 2. As an example, the acoustic resonator filter bank system 200 can be fabricated in an IC.

The acoustic resonator filter bank system 200 includes an input switch 202 that is configured to receive the RF input signal $RF_{IN}$ and an input switching signal $SW_{IN}$. The input switch 202 is demonstrated in the example of FIG. 2 as a single-pole triple-throw (SP3T) switch, and is thus configured to selectively provide the RF input signal $RF_{IN}$ to a single one of three filter paths, demonstrated at 204, 206, and 208. Therefore, the integer N in the example of FIG. 1 is demonstrated as N=3 in the example of FIG. 2. As an example, the input switch 202 can be formed from one or more SLCFET switches to accommodate a broad frequency band of the RF input signal $RF_{IN}$.

The acoustic resonator filter bank system 200 also includes a first multiplex passive filter 210 associated with the first filter path 204, a second multiplex passive filter 212 associated with the second filter path 206, and a third multiplex passive filter 214 associated with the third filter path 208. Each of the multiplex passive filters 210, 212, and 214 can include a low-pass filter configured to provide a low-pass filtered version of the RF input signal $RF_{INLPX}$, a band-pass filter configured to provide a band-pass filtered version of the RF input signal $RF_{INBPX}$, and a high-pass filter configured to provide a high-pass filtered version of the RF input signal $RF_{INHPX}$, where X corresponds to the respective first, second, or third of the multiplex passive filters 210, 212, or 214. The filtered versions of the RF input signal $RF_{INLPX}$, $RF_{INBPX}$, and $RF_{INHPX}$ can each have relatively large frequency bands to encapsulate a large variation of smaller pass-bands, as described in greater detail herein.

The acoustic resonator filter bank system 200 also includes a first switching matrix 216 coupled to the first multiplex passive filter 210, a second switching matrix 218 coupled to the second multiplex passive filter 212, and a third switching matrix 220 coupled to the third multiplex passive filter 212. Each of the switch matrices 216, 218, and 220 is configured to provide one of the filtered versions of the RF input signal $RF_{INLPX}$, $RF_{INBPX}$, and $RF_{INHPX}$ to a single output of the respective one of the switch matrices 216, 218, and 220 in response to a selection switching signal $SW_{SELX}$, where X corresponds to the respective first, second, or third of the switch matrices 216, 218, and 220. As an example, the switch matrices 216, 218, and 220 can be formed from SLCFET switches to accommodate the broad frequency band of the RF input signal $RF_{IN}$.

The acoustic resonator filter bank system 200 also includes a first filter bank 222 coupled to the first switch matrix 216, a second filter bank 224 coupled to the second switch matrix 218, and a third filter bank 226 coupled to the third switch matrix 220. Each of the filter banks 222, 224, and 226 includes three filter blocks 228, designated as "FILTER BLOCK X_Z", where X corresponds to the respective first, second, or third of the filter banks 222, 224, and 226, and where Z corresponds to the first, second, or third of the filter blocks 228 in the respective one of the filter banks 222, 224, and 226. Each of the filter blocks 228 is configured to provide a distinct set of pass-bands, such as related by harmonics (e.g., insertion harmonics). The distinct pass-bands can be provided based on physical and/or circuit characteristics associated with the respective filter block 228.

Figure 3:
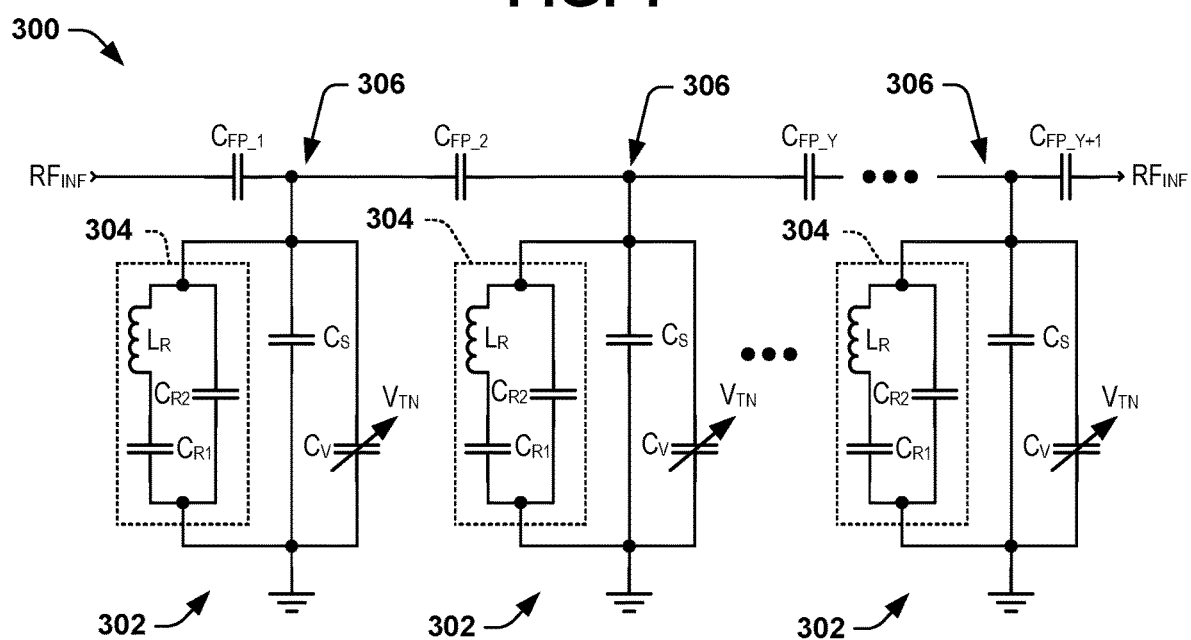
FIG. 3 illustrates an example diagram of a filter block.

FIG. 3 illustrates an example diagram of a filter block 300. The filter block 300 can correspond to any one of the filter blocks 228 in the example of FIG. 2. Therefore, reference is to be made to the example of FIG. 2 in the following description of the example of FIG. 3.

The filter block 300 includes a plurality Y of filter elements 302, where Y is a positive integer. Each of the filter elements 302 includes an acoustic resonator 304, a capacitor $C_S$, and another capacitor $C_V$ arranged in parallel. In the example of FIG. 3, the capacitor is demonstrated as a variable capacitor (varactor), such that a voltage $V_{TN}$ could be provided to set the capacitance of the capacitor $C_V$. Alternatively, the capacitor $C_V$ could have a fixed capacitance, or the capacitors $C_S$ and $C_V$ could be combined into a single equivalent capacitance.

The acoustic resonator 304 is demonstrated in the example of FIG. 3 as including a first capacitor $C_{R1}$ and an inductor $L_R$ arranged in series, with the series arrangement of the first capacitor $C_{R1}$ and the inductor $L_R$ being arranged in parallel with a second capacitor $C_{R2}$. The circuit arrangement of the acoustic resonator 304 can be representative of operational characteristics of the acoustic resonator 304. For example, the values of the first capacitor $C_{R1}$, the second capacitor $C_{R2}$, and the inductor $L_R$ can be based on physical characteristics (e.g., substrate dimensions) of the acoustic resonator 304. The filter elements 302 can be arranged in a symmetrical manner with respect to the first, last, and intermediate filter elements 302 to provide appropriate impedance matching and filter matching characteristics.

As an example, the acoustic resonator 304 can be configured as a COR (e.g., an aluminum nitride (AlN) COR). Therefore, the acoustic resonators 304 can exhibit a high quality factor (Q) at frequencies both above and below a given range of frequencies of the RF input signal $RF_{IN}$ (e.g., Ka-band). For example, the CORs can operate at a Q between approximately 400 and approximately 1000. Additionally, the acoustic resonators 304 configured as CORs can provide a shape factor selectivity of approximately 1.03 to provide significant out-of-band and interference rejection of the RF input signal $RF_{IN}$. Such a selectivity can achieve a rejection of approximately 60 dB at approximately 50 MHz on either side of a 3.5 GHz bandwidth, thus providing a significantly greater rejection characteristic of conventional acoustic resonator filters (e.g., exhibiting a selectivity of approximately 1.5).

The parallel arrangement of the acoustic resonator 304, the capacitor $C_S$, and the capacitor $C_V$ can provide for significantly improved filter characteristics over conventional filters. For example, the split capacitance provided by the capacitors $C_S$ and $C_V$ in parallel with the acoustic resonator 304 can provide for the ability to tune of the filter element 302 over a broad frequency range with minimal impact to quality factor Q and insertion loss. As an example, the capacitor $C_V$ can be configured as a barium strontium titanate (BST) varactor, thus enabling a tuning range of approximately 33% with a loss tangent of approximately 0.006 and a quality factor Q of approximately 40 at a frequency of approximately 18 GHz. Therefore, the split capacitor arrangement of the capacitors $C_S$ and $C_V$ in parallel with the acoustic resonator 304 can provide for a large range of frequency tuning without providing performance degradation of the filter block 300.

In the example of FIG. 3, each of the filter elements 302 is arranged between a filter-path node 306 and a low-voltage rail, demonstrated in the example of FIG. 3 as ground. Each of the filter-path nodes 306 interconnects a pair of filter-path capacitors, demonstrated in the example of FIG. 3 as capacitors $C_{FP\_1}$ through $C_{FP\_Y+1}$ for the set of Y filter elements. Therefore, the filter-path capacitors $C_{FP\_1}$ through $C_{FP\_Y+1}$ number one greater in quantity than the Y filter elements 302. The filtered version of the RF input signal, demonstrated in the example of FIG. 3 as a signal $RF_{INF}$, is provided in a signal path through the filter-path capacitors $C_{FP\_1}$ through $C_{FP\_Y+1}$. Therefore, based on the arrangement of the filter elements 302 between the filter-path capacitors $C_{FP\_1}$ through $C_{FP\_Y+1}$, the filter block 300 is configured to provide a plurality of harmonically related pass-bands. As an example, the pass-bands can each have an approximate 10% bandwidth.

Referring back to the example of FIG. 2, the filter blocks 228 of each of the filter banks 222, 224, and 226 can each provide a distinct set of pass-bands across a frequency spectrum associated with the RF input signal $RF_{IN}$. For example, each of the filter blocks 228 can provide a first pass-band, a second pass-band higher than the first pass-band, and a third pass-band higher than the second pass-band, with the first, second, and third pass-bands being harmonically related. As an example, based on the bandwidth of the pass-bands of each of the filter blocks 228, the center frequencies of the pass-bands can be selected to provide that the pass-bands, taken in the aggregate, can collectively span the entirety of the frequency spectrum. Therefore, as described herein, the acoustic resonator filter bank system 200 can be configured to provide selectivity of any pass-band of interest in the frequency spectrum.

In the example of FIG. 2, each of the filter blocks 228 of the first filter bank 222 is coupled to a respective one output of the switch matrix 216, each of the filter blocks 228 of the second filter bank 224 is coupled to a respective one output of the switch matrix 218, and each of the filter blocks 228 of the third filter bank 226 is coupled to a respective one output of the switch matrix 220. As described above, each of the switch matrices 216, 218, and 220 is configured to provide one of the filtered versions of the RF input signal $RF_{INLPX}$, $RF_{INBPX}$, and $RF_{INHPX}$ to a single output of the respective one of the switch matrices 216, 218, and 220, and thus to a respective one of the filter blocks 228 in the respective one of the filter banks 222, 224, and 226. Therefore, based on which of the filtered versions of the RF input signal $RF_{INLPX}$, $RF_{INBPX}$, and $RF_{INHPX}$ is provided to the respective one of the filter blocks 228, the respective filter block 228 can output the RF output signal $RF_{OUT}$ having a frequency band corresponding to one of the first, second, and third pass-bands associated with the respective filter block 228.

In the example of FIG. 2, the filter block 228 provides the filtered RF output signal $RF_{OUT}$ to a signal demultiplexer 230 that is coupled to all of the filter blocks 228 to provide the RF output signal $RF_{OUT}$ from the acoustic resonator filter bank system 200. As an example, the signal demultiplexer 230 can be implemented using a set of SLCFET switches. Alternatively, the signal demultiplexer 230 could instead be implemented as a passive signal combiner. Accordingly, the acoustic resonator filter bank system 200 can selectively filter the RF input signal $RF_{IN}$ to provide the RF output signal $RF_{OUT}$ having a frequency band corresponding to a single one pass-band in the frequency spectrum that spans the entirety of all of the pass-bands of all of the filter blocks 228.

Figure 4:
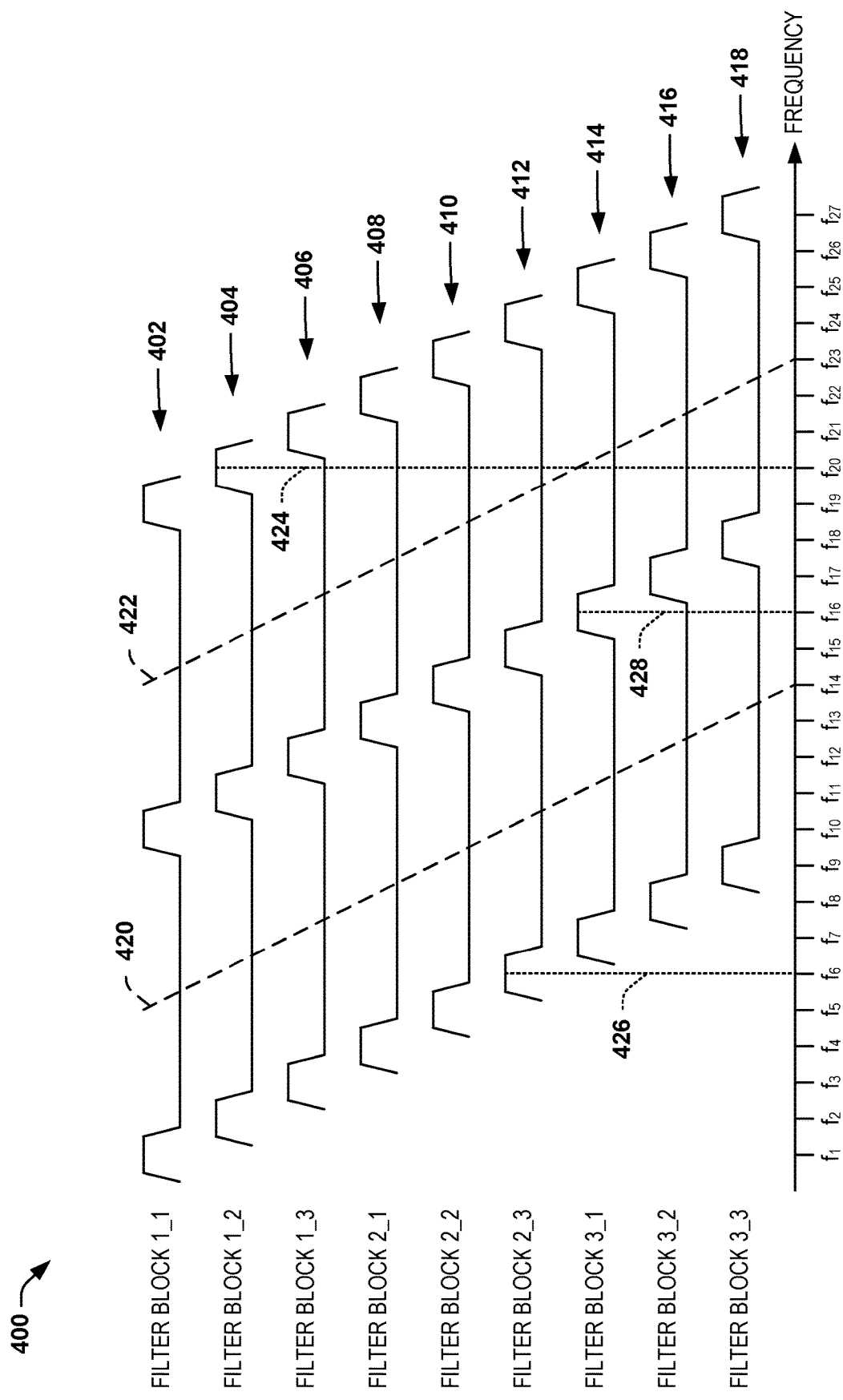
FIG. 4 illustrates an example diagram of filter block responses.

FIG. 4 illustrates an example diagram 400 of filter block responses. The diagram 400 demonstrates the pass-bands of each of the filter blocks 228. Therefore, reference is to be made to the example of FIG. 2 in the following description of the example of FIG. 4.

The diagram 400 includes a first frequency response 402 that corresponds to the first filter block 228 of the first filter bank 222 ("FILTER BLOCK 1_1"), a second frequency response 404 that corresponds to the second filter block 228 of the first filter bank 222 ("FILTER BLOCK 1_2"), and a third frequency response 406 that corresponds to the third filter block 228 of the first filter bank 222 ("FILTER BLOCK 1_3"). The diagram 400 also includes a fourth frequency response 408 that corresponds to the first filter block 228 of the second filter bank 224 ("FILTER BLOCK 2_1"), a fifth frequency response 410 that corresponds to the second filter block 228 of the second filter bank 224 ("FILTER BLOCK 2_2"), and a sixth frequency response 412 that corresponds to the third filter block 228 of the second filter bank 224 ("FILTER BLOCK 2_3"). The diagram 400 further includes a seventh frequency response 414 that corresponds to the first filter block 228 of the third filter bank 226 ("FILTER BLOCK 3_1"), an eighth frequency response 416 that corresponds to the second filter block 228 of the third filter bank 226 ("FILTER BLOCK 3_2"), and a ninth frequency response 418 that corresponds to the third filter block 228 of the third filter bank 226 ("FILTER BLOCK 3_3"). Each of the frequency responses 402, 404, 406, 408, 410, 412, 414, 416, and 418 include three separate pass-bands that are harmonically related. As an example, each of the pass-bands can have an approximate 10% bandwidth based on the characteristics of the filter blocks 228, such as the physical characteristics of the acoustic resonator 304 and/or the capacitance values of the capacitors $C_V$ and $C_S$.

The diagram 400 demonstrates a frequency spectrum that spans frequencies from a lowest frequency $f_1$ to a highest frequency $f_{27}$, with frequencies therebetween. Each of the frequencies $f_1$ through $f_{27}$ corresponds to a center frequency of a given one of the pass-bands in the frequency responses 402, 404, 406, 408, 410, 412, 414, 416, and 418. As demonstrated in the example of FIG. 4, the pass-bands of the frequency responses 402, 404, 406, 408, 410, 412, 414, 416, and 418, taken in the aggregate, can span the entirety of the frequency spectrum from just less than the lowest frequency $f_1$ (based on the bandwidth of the pass-band centered about the frequency $f_1$) to just greater than the highest frequency $f_{27}$ (based on the bandwidth of the pass-band centered about the frequency $f_{27}$) in an uninterrupted manner. Therefore, the pass-bands of the frequency responses 402, 404, 406, 408, 410, 412, 414, 416, and 418 can be selectively applied to the RF input signal $RF_{IN}$ to include any frequency in the frequency spectrum of the diagram 400.

As described above in the example of FIG. 2, each of the multiplex passive filters 210, 212, and 214 can include a low-pass filter configured to provide a low-pass filtered version of the RF input signal $RF_{IN}$, a band-pass filter configured to provide a band-pass filtered version of the RF input signal $RF_{IN}$, and a high-pass filter configured to provide a high-pass filtered version of the RF input signal $RF_{IN}$. The multiplex passive filters 210, 212, and 214 can be tuned differently with respect to each other to filter different frequencies that are associated with the frequencies of the pass-bands of the filter blocks 228 of the respective filter banks 222, 224, and 226. In the example of FIG. 4, the diagram 400 includes a first dashed line 420 and a second dashed line 422 that are representative of filter setpoints of the multiplex passive filters 210, 212, and 214. The dashed lines 420 and 422 are provided as examples, and may not be representative of actual or specific filter setpoints relative to and/or to scale with the pass-bands of the frequency responses 402, 404, 406, 408, 410, 412, 414, 416, and 418.

For example, the dashed line 420 can represent an approximate frequency below which the low-pass filter portion of the multiplex passive filters 210, 212, and 214 can provide low-pass of the frequency spectrum in the diagram 400. Similarly, the dashed line 422 can represent an approximate frequency above which the high-pass filter portion of the multiplex passive filters 210, 212, and 214 can provide high-pass of the frequency spectrum in the diagram 400. Similarly, the dashed lines 420 and 422 can represent approximate frequencies between which the band-pass filter portion of the multiplex passive filters 210, 212, and 214 can provide band-pass of the frequency spectrum in the diagram 400. Therefore, as described above, the combination of the multiplex passive filters 210, 212, and 214 and the filter blocks 228, as provided by the input switch 202 and the switch matrices 216, 218, and 220, can determine which one specific band-pass of the filter blocks 228 can be selected as a pass-band for the RF input signal $RF_{IN}$ to provide the RF output signal $RF_{OUT}$.

With additional reference to FIG. 2, as a first example, the input switch 202 can be switched to a first state by the input switching signal $SW_{IN}$ to provide the RF input signal $RF_{IN}$ to the first filter path 204. The RF input signal $RF_{IN}$ is thus provided to the first passive multiplex filter 210. The first passive multiplex filter 210 thus provides the filtered versions of the RF input signal $RF_{INLP1}$, $RF_{INBP1}$, and $RF_{INHP1}$ to the first switch matrix 216. The selection switching signal $SW_{SEL1}$ can be set to provide one of the filtered versions of the RF input signal $RF_{INLP1}$, $RF_{INBP1}$, and $RF_{INHP1}$ to be provided to one of the filter blocks 228 of the first filter bank 222. For example, the selection switching signal $SW_{SEL1}$ can be set to provide the high-pass filtered version of the RF input signal $RF_{INHP1}$ to be provided to the second filter block 228 ("FILTER BANK 1_2") of the first filter bank 222. Therefore, as demonstrated in the example of FIG. 4, the high-pass filtered version of the RF input signal $RF_{INHP1}$ provided to the second filter block 228 ("FILTER BANK 1_2") of the first filter bank 222 is associated with the pass-band having a center frequency at the frequency $f_{20}$, as demonstrated by the dotted line 424. Therefore, the RF output signal $RF_{OUT}$ is provided having a frequency band corresponding to the pass-band having a center frequency at the frequency $f_{20}$.

As a second example, the input switch 202 can be switched to a second state by the input switching signal $SW_{IN}$ to provide the RF input signal $RF_{IN}$ to the second filter path 206. The RF input signal $RF_{IN}$ is thus provided to the second passive multiplex filter 212. The second passive multiplex filter 212 thus provides the filtered versions of the RF input signal $RF_{INLP2}$, $RF_{INBP2}$, and $RF_{INHP2}$ to the second switch matrix 218. The selection switching signal $SW_{SEL2}$ can be set to provide one of the filtered versions of the RF input signal $RF_{INLP2}$, $RF_{INBP2}$, and $RF_{INHP2}$ to be provided to one of the filter blocks 228 of the second filter bank 224. For example, the selection switching signal $SW_{SEL2}$ can be set to provide the low-pass filtered version of the RF input signal $RF_{INLP2}$ to be provided to the third filter block 228 ("FILTER BANK 2_3") of the second filter bank 224. Therefore, as demonstrated in the example of FIG. 4, the low-pass filtered version of the RF input signal $RF_{INLP2}$ provided to the second filter block 228 ("FILTER BANK 2_3") of the second filter bank 224 is associated with the pass-band having a center frequency at the frequency $f_6$, as demonstrated by the dotted line 426. Therefore, the RF output signal $RF_{OUT}$ is provided having a frequency band corresponding to the pass-band having a center frequency at the frequency $f_6$.

As a third example, the input switch 202 can be switched to a third state by the input switching signal $SW_{IN}$ to provide the RF input signal $RF_{IN}$ to the third filter path 208. The RF input signal $RF_{IN}$ is thus provided to the third passive multiplex filter 214. The third passive multiplex filter 214 thus provides the filtered versions of the RF input signal $RF_{INLP3}$, $RF_{INBP3}$, and $RF_{INHP3}$ to the third switch matrix 220. The selection switching signal $SW_{SEL3}$ can be set to provide one of the filtered versions of the RF input signal $RF_{INLP3}$, $RF_{INBP3}$, and $RF_{INHP3}$ to be provided to one of the filter blocks 228 of the third filter bank 226. For example, the selection switching signal $SW_{SEL3}$ can be set to provide the band-pass filtered version of the RF input signal $RF_{INBP3}$ to be provided to the first filter block 228 ("FILTER BANK 3_1") of the third filter bank 226. Therefore, as demonstrated in the example of FIG. 4, the band-pass filtered version of the RF input signal $RF_{INBP3}$ provided to the first filter block 228 ("FILTER BANK 3_1") of the third filter bank 226 is associated with the pass-band having a center frequency at the frequency $f_{16}$, as demonstrated by the dotted line 428. Therefore, the RF output signal $RF_{OUT}$ is provided having a frequency band corresponding to the pass-band having a center frequency at the frequency $f_{16}$.

Therefore, the examples of FIGS. 2 and 4 demonstrate that, by selectively switching one of the filtered versions of the RF input signal $RF_{IN}$ to a given one of the filter blocks 228 of a given one of the filter paths 204, 206, and 208, the acoustic resonator filter bank system 200 can provide for a frequency band of the RF output signal $RF_{OUT}$ corresponding to a single pass-band across the entirety of the frequency spectrum in the diagram 400. Thus, the acoustic resonator filter bank system 200 can provide for specific selectivity of filter bands across a large RF frequency spectrum. As described above, based on the structure of the filter blocks 228 in the filter banks 222, 224, and 226 of the acoustic resonator filter bank system 200 (e.g., based on the structure of the filter block 300 in the example of FIG. 3), the acoustic resonator filter bank system 200 can be implemented on an integrated circuit to provide for a compact filtering package that is able to provide selective filtering across frequencies of the frequency spectrum having an order of magnitude or more of difference in wavelength (e.g., from the frequency $f_1$ to the frequency $f_{27}$). Accordingly, the acoustic resonator filter bank system 200 can provide for flexible filtering across a broad frequency spectrum on a single compact IC chip.

Figure 5:
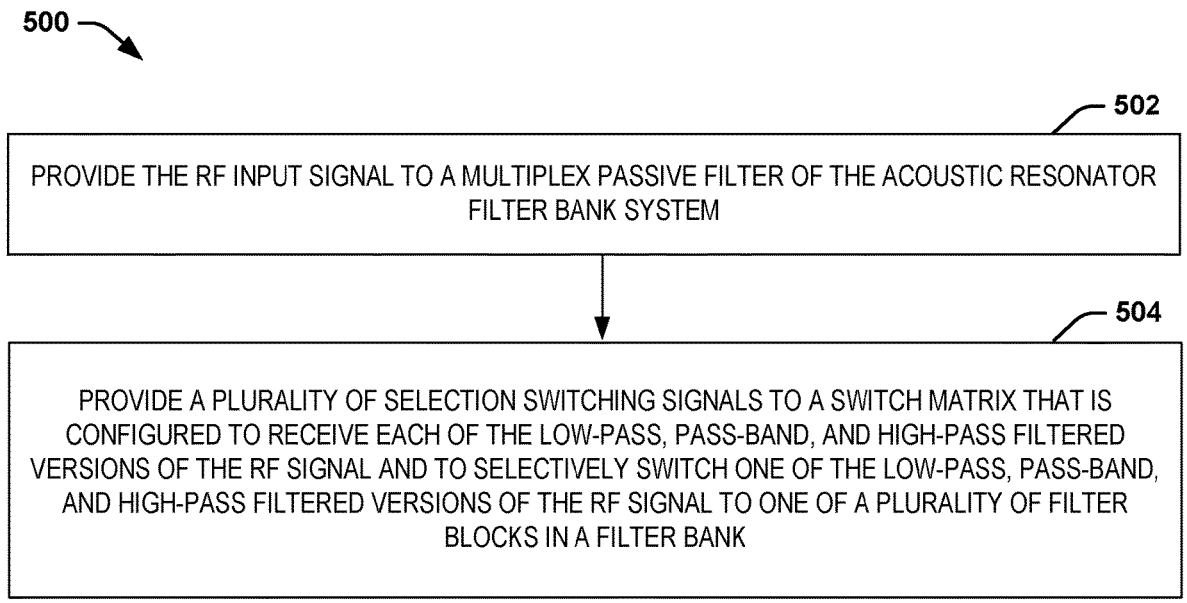
FIG. 5 illustrates an example of a method for filtering an RF input signal via an acoustic resonator filter bank system.

In view of the foregoing structural and functional features described above, a methodology in accordance with various aspects of the disclosure will be better appreciated with reference to FIG. 5. It is to be understood and appreciated that the method of FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 5 illustrates an example of a method 500 for filtering a radio frequency (RF) input signal (e.g., the RF input signal $RF_{IN}$) via an acoustic resonator filter bank system (e.g., the acoustic resonator filter bank system 100). At 502, the RF input signal is provided to a multiplex passive filter (e.g., the multiplex passive filter 104) of the acoustic resonator filter bank system. The multiplex passive filter can include a low-pass filter configured to provide a low-pass filtered version of the RF input signal, a band-pass filter configured to provide a band-pass filtered version of the RF input signal, and a high-pass filter configured to provide a high-pass filtered version of the RF input signal. At 504, a plurality of selection switching signals (e.g., the selection switching signals $SW_{SEL}$) are provided to a switch matrix (e.g., the switch matrix 108) that is configured to receive each of the low-pass, pass-band, and high-pass filtered versions of the RF input signal and to selectively switch one of the low-pass, pass-band, and high-pass filtered versions of the RF input signal to one of a plurality of filter blocks in a filter bank. Each of the filter blocks can include an acoustic resonator and is configured to provide a first pass-band, a second pass-band higher than the first pass-band, and a third pass-band higher than the second pass-band to provide an RF output signal (e.g., the RF output signal $RF_{OUT}$) having a frequency band corresponding to a respective one of the first pass-band, the second pass-band, and the third pass-band.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An acoustic resonator filter bank system comprising:
a multiplex passive filter that is configured to provide a plurality of filtered versions of a radio frequency (RF) input signal;
a filter bank that comprises a plurality of filter blocks that are each configured to provide a plurality of pass-bands across a frequency spectrum, each of the filter blocks comprising a plurality of filter elements arranged between a respective plurality of filter-path nodes and a low-voltage rail, each plurality of filter elements including a plurality of filter-path capacitors in parallel with an acoustic resonator; and
a switch matrix that is configured to provide one of the filtered versions of the RF input signal to one of the filter blocks in the filter bank to provide an RF output signal having a frequency band corresponding to a respective one of the pass-bands.

2. The system of claim 1, wherein the acoustic resonator is arranged as a combined overtone resonator.

3. The system of claim 1, wherein the switch matrix comprises a plurality of super lattice castellated gate field effect transistor (SLCFET) switches configured to switch the one of the filtered versions of the RF input signal to one of the filter blocks.

4. The system of claim 1, wherein the multiplex passive filter is one of a plurality of multiplex passive filters that are each associated with a respective one of a plurality of filter paths, wherein the filter bank is one of a plurality of filter banks that are each associated with a respective one of the filter paths, wherein the switch matrix is one of a plurality of switch matrices that are each associated with a respective one of the plurality of filter paths, the system further comprising an input switch configured to provide the RF input signal to one of the filter paths.

5. The system of claim 4, wherein each of the filter blocks of each of the filter banks are configured to provide a plurality of distinct pass-bands across the frequency spectrum, such that the pass-bands collectively span the entirety of the frequency spectrum.

6. The system of claim 1, wherein the plurality of pass-bands associated with each of the filter blocks comprises a first pass-band, a second pass-band higher than the first pass-band, and a third pass-band higher than the second pass-band, wherein the first, second, and third pass-bands that are harmonically related.

7. The system of claim 6, wherein the multiplex passive filter comprises a low-pass filter configured to provide a low-pass filtered version of the RF input signal, a band-pass filter configured to provide a band-pass filtered version of the RF input signal, and a high-pass filter configured to provide a high-pass filtered version of the RF input signal, wherein the switch matrix is configured to provide one of the low-pass, band-pass, and high-pass versions of the RF input signal to one of the filter blocks to provide the RF output signal having a respective one of the first pass-band, the second pass-band, and the third pass-band.

8. An integrated circuit (IC) comprising the acoustic resonator filter bank system of claim 1.

9. A method for filtering a radio frequency (RF) input signal via an acoustic resonator filter bank system, the method comprising:
providing the RF input signal to a multiplex passive filter of the acoustic resonator filter bank system, the multiplex passive filter comprising a low-pass filter configured to provide a low-pass filtered version of the RF input signal, a band-pass filter configured to provide a band-pass filtered version of the RF input signal, and a high-pass filter configured to provide a high-pass filtered version of the RF input signal; and
providing a plurality of selection switching signals to a switch matrix that is configured to receive each of the low-pass, pass-band, and high-pass filtered versions of the RF input signal and to selectively switch one of the low-pass, pass-band, and high-pass filtered versions of the RF input signal to one of a plurality of filter blocks in a filter bank, each of the filter blocks comprising a plurality of filter elements arranged between a respective plurality of filter-path nodes and a low-voltage rail, each plurality of filter elements including a plurality of filter-path capacitors in parallel with an acoustic resonator and is configured to provide a first pass-band, a second pass-band higher than the first pass-band, and a third pass-band higher than the second pass-band to provide an RF output signal having a frequency band corresponding to a respective one of the first pass-band, the second pass-band, and the third pass-band.

10. The method of claim 9, wherein the acoustic resonator is arranged as a combined overtone resonator.

11. The method of claim 9, the method further comprising providing an input switch signal to an input switch to provide the RF input signal to one of a plurality of filter paths,
wherein providing the RF input signal to the multiplex passive filter comprises providing the RF input signal to one of a plurality of multiplex passive filter that are each associated with a respective one of the plurality of filter paths, and
wherein providing the selection switching signals to the switch matrix comprises providing the selection switching signals to a respective one of a plurality of switch matrices that are each associated with a respective one of the filter paths to selectively switch one of the low-pass, pass-band, and high-pass filtered versions of the RF input signal to one of the filter blocks in a respective one of a plurality of filter banks that are each associated with a respective one of the filter paths.

12. The method of claim 11, wherein each of the filter blocks of each of the filter banks are configured to provide a plurality of distinct pass-bands across frequency spectrum, such that the pass-bands collectively span the entirety of the frequency spectrum.

13. An acoustic resonator filter bank system comprising:
an input switch configured to provide a radio frequency (RF) input signal to one of a plurality of filter paths;
a plurality of multiplex passive filters that are each associated with a respective one of the filter paths, each of the multiplex passive filters being configured to provide a plurality of filtered versions of the RF input signal in response to receiving the RF input signal from the input switch;
a plurality of filter banks that are each associated with a respective one of the filter paths, each of the filter banks comprising a plurality of filter blocks that are each configured to provide a plurality of pass-bands across a frequency spectrum, each of the filter blocks comprising a plurality of filter elements arranged between a respective plurality of filter path nodes and a low-voltage rail, each plurality of filter elements including a plurality of filter path capacitors in parallel with an acoustic resonator; and a plurality of switch matrices that are each associated with a respective one of the filter paths, each of the switch matrices being configured to provide one of the filtered versions of the RF input signal to one of the filter blocks in a respective one of the filter banks to provide an RF output signal having a frequency band corresponding to a respective one of the pass-bands.

14. The system of claim 13, wherein the acoustic resonator is arranged as a combined overtone resonator.

15. The system of claim 13, wherein the plurality of pass-bands associated with each of the filter blocks of each of the filter banks comprises a first pass-band, a second pass-band higher than the first pass-band, and a third pass-band higher than the second pass-band, wherein the first, second, and third pass-bands that are harmonically related.

16. The system of claim 15, wherein each of the multiplex passive filters comprises a low-pass filter configured to provide a low-pass filtered version of the RF input signal, a band-pass filter configured to provide a band-pass filtered version of the RF input signal, and a high-pass filter configured to provide a high-pass filtered version of the RF input signal, wherein each of the switch matrices is configured to provide one of the low-pass, band-pass, and high-pass versions of the RF input signal to one of the filter blocks of the respective one of the filter banks to provide the RF output signal having a respective one of the first pass-band, the second pass-band, and the third pass-band.

\* \* \* \* \*